(12) United States Patent
Ichikawa et al.

(10) Patent No.: US 9,743,021 B2
(45) Date of Patent: Aug. 22, 2017

(54) IMAGING APPARATUS, IMAGING SYSTEM, AND METHOD FOR DRIVING IMAGING APPARATUS

(71) Applicant: CANON KABUSHIKI KAISHA, Tokyo (JP)

(72) Inventors: Takeshi Ichikawa, Hachioji (JP); Masahiro Kobayashi, Tokyo (JP); Yusuke Onuki, Fujisawa (JP); Toru Koizumi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/091,314

(22) Filed: Apr. 5, 2016

(65) Prior Publication Data

US 2016/0301887 A1     Oct. 13, 2016

(30) Foreign Application Priority Data

Apr. 8, 2015  (JP) ................................ 2015-079476

(51) Int. Cl.
| | |
|---|---|
| *H04N 5/378* | (2011.01) |
| *H04N 5/357* | (2011.01) |
| *H04N 5/353* | (2011.01) |
| *H04N 5/3745* | (2011.01) |
| *H01L 27/146* | (2006.01) |

(52) U.S. Cl.
CPC ....... *H04N 5/3575* (2013.01); *H01L 27/1461* (2013.01); *H01L 27/14614* (2013.01); *H01L 27/14621* (2013.01); *H01L 27/14623* (2013.01); *H01L 27/14627* (2013.01); *H01L 27/14629* (2013.01); *H04N 5/353* (2013.01); *H04N 5/37452* (2013.01)

(58) Field of Classification Search
CPC .. H04N 5/3575; H04N 5/353; H04N 5/37452; H01L 27/1461; H01L 27/14629; H01L 27/14621; H01L 27/14623; H01L 27/14627; H01L 27/14614
See application file for complete search history.

(56) References Cited

U.S. PATENT DOCUMENTS

| | | | | |
|---|---|---|---|---|
| 6,963,116 B2 * | 11/2005 | Kawahito | ............ | H04N 5/363 257/414 |
| 7,423,678 B2 * | 9/2008 | Shimizu | ............... | H04N 5/2176 348/294 |
| 8,189,086 B2 * | 5/2012 | Hashimoto | .......... | H04N 5/3456 348/222.1 |

FOREIGN PATENT DOCUMENTS

JP        2004-111590 A       4/2004

* cited by examiner

*Primary Examiner* — Padma Haliyur
(74) *Attorney, Agent, or Firm* — Canon USA, Inc. IP Division

(57) ABSTRACT

The imaging apparatuses according to the embodiments perform an operation of outputting a plurality of signals from pixels to an output line a plurality of times. In each operation, both of first and second transfer switches are brought into an on state so that a discharge operation of discharging charge of a photoelectric conversion unit through a holding unit is performed. In a first period, the photoelectric conversion unit of at least one of the pixels accumulates charge. The operation performed a plurality of times includes a first operation and a second operation to be performed after the first operation. After the output operation in the first operation is terminated, the discharge operation in the second operation is performed.

20 Claims, 9 Drawing Sheets

IMAGING APPARATUS, IMAGING SYSTEM, AND METHOD FOR DRIVING IMAGING APPARATUS

BACKGROUND OF THE INVENTION

Field of the Invention

The present disclosure relates to an imaging apparatus, imaging system, and a method for driving the imaging apparatus.

Description of the Related Art

In recent years, employment of a global electronic shutter in CMOS image sensors has been proposed. Imaging apparatuses disclosed in Japanese Patent Laid-open No. 2004-111590 have an advantage in that, even when an image of a quickly-moving object is captured, the object image is not distorted.

SUMMARY OF THE INVENTION

According to an aspect of the present disclosure, a method for driving an imaging apparatus is provided. The imaging apparatus includes a plurality of pixels each of which includes a photoelectric conversion unit which generates charge in response to incident light and accumulates the charge, a holding unit which holds the charge, an amplification unit which outputs a signal in accordance with the charge, a first transfer switch which transfers the charge from the photoelectric conversion unit to the holding unit, a second transfer switch which transfers the charge from the holding unit to the amplification unit, and an output line which outputs a plurality of signals supplied from the plurality of pixels. The method for driving the imaging apparatus method includes performing an operation of outputting the plurality of signals to the output line a plurality of times. In each operation performed a plurality of times, both of the first and second transfer switches are brought into an on state so that a discharge operation of discharging charge of the photoelectric conversion unit through the holding unit is performed, the first transfer switches of the plurality of pixels in an on state are brought into an off state at a first time point after the discharge operation so that accumulation of the charge is started in the photoelectric conversion units of the plurality of pixels, from the first time point to a second time point, the first transfer switch of at least one of the plurality of pixels is maintained in an off state and the photoelectric conversion unit of the at least one of the pixels accumulates charge generated in the first period from the first time point to the second time point, from the second time point to a third time point, the holding units of the plurality of pixels hold charge generated in the first period and charge generated in a second period from the second time point to the third time point, a state of the first transfer switches of the plurality of pixels are changed from an on state to an off state at the third time point, and the second transfer switches of the plurality of pixels are successively turned on and an output operation of successively outputting the plurality of signals to the output line is performed in a third period from the third time point to a fourth time point. The operation performed a plurality of times includes a first operation and a second operation to be performed after the first operation. The discharge operation in the second operation is performed after the output operation in the first operation is terminated.

According to another aspect of the present disclosure, an imaging apparatus includes a plurality of pixels each of which includes a photoelectric conversion unit which generates charge in response to incident light and accumulate the charge, a holding unit which holds the charge, an amplification unit which outputs a signal in accordance with the charge, a first transfer switch which transfers the charge from the photoelectric conversion unit to the holding unit, and a second transfer switch which transfers the charge from the holding unit to the amplification unit, and an output line to which signals are output from the pixels. An operation of outputting the plurality of signals to the output line is performed a plurality of times. In each operation performed a plurality of times, both of the first and second transfer switches are brought into an on state so that a discharge operation of discharging charge of the photoelectric conversion unit through the holding unit is performed, the first transfer switches of the plurality of pixels in an on state are brought into an off state at a first time point after the discharge operation so that accumulation of the charge is started in the photoelectric conversion units of the plurality of pixels, from the first time point to a second time point, the first transfer switch of at least one of the plurality of pixels is maintained in an off state and the photoelectric conversion unit of the at least one of the pixels accumulates charge generated in the first period from the first time point to the second time point, from the second time point to a third time point, the holding units of the plurality of pixels hold charge generated in the first period and charge generated in a second period from the second time point to the third time point, a state of the first transfer switches of the plurality of pixels are changed from an on state to an off state at the third time point, and the second transfer switches of the plurality of pixels are successively turned on and an output operation of successively outputting the plurality of signals to the output line is performed in a third period from the third time point to a fourth time point. The operation performed a plurality of times includes a first operation and a second operation to be performed after the first operation. The discharge operation in the second operation is performed after the output operation in the first operation is terminated.

Further features of the present invention will become apparent from the following description of exemplary embodiments with reference to the attached drawings.

DESCRIPTION OF THE EMBODIMENTS

Figure 1:
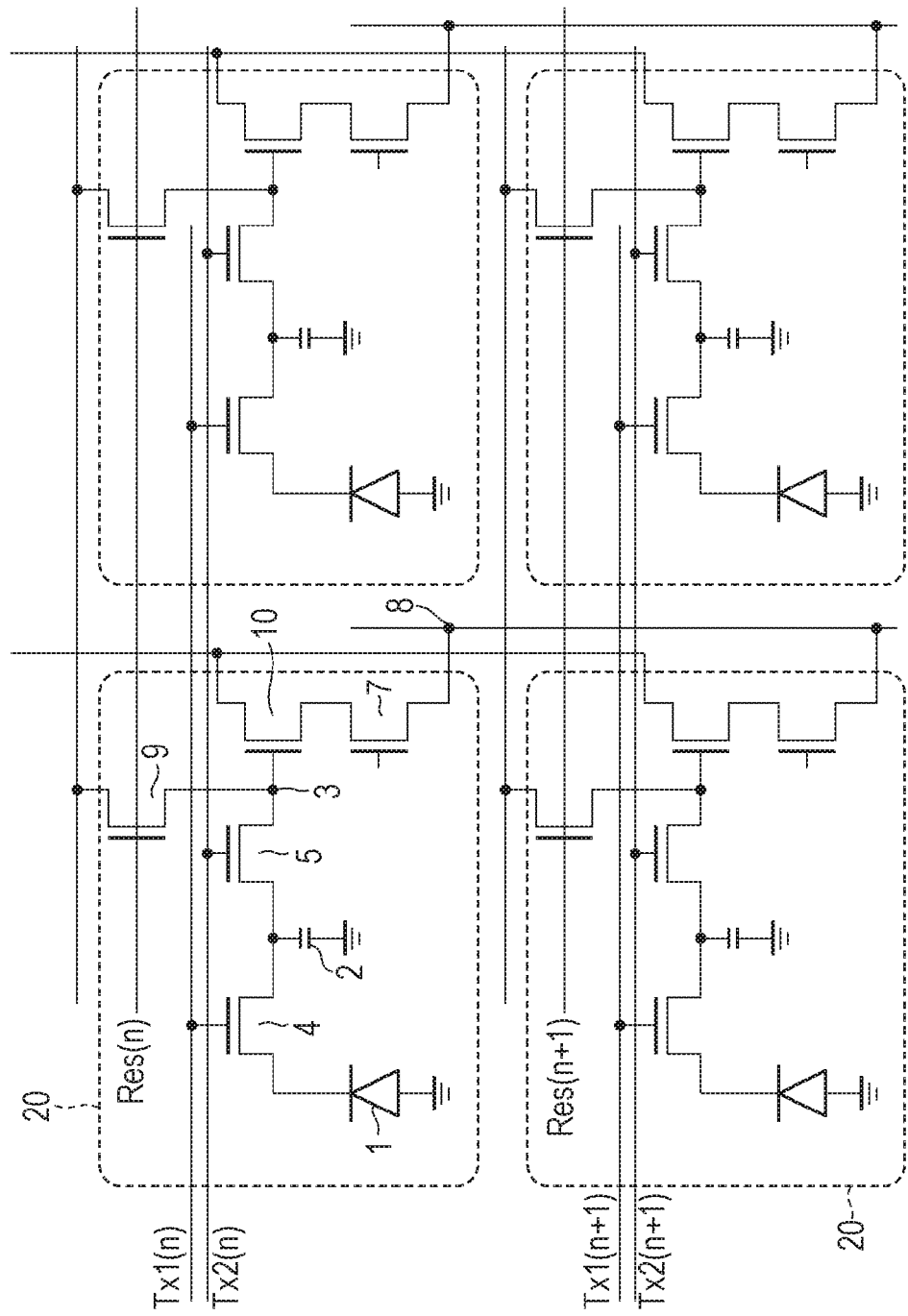
FIG. 1 is a diagram illustrating an equivalent circuit of an imaging apparatus.

According to embodiments below, a global electronic shutter may be operated while saturation charge quantity is improved.

In an imaging apparatus known by inventors, all charge generated by photoelectric conversion for obtaining one image or one frame is accumulated in photoelectric conversion units. Thereafter, the charge in all pixels is simultaneously transferred from the photoelectric conversion units to holding units, and photoelectric conversion is started to obtain a next image or a next frame. Therefore, in order to increase saturation charge quantity of the pixel, saturation charge quantity of the photoelectric conversion unit and saturation charge quantity of the holding unit are substantially the same. When the saturation charge quantity of the photoelectric conversion unit increases, an area of the photoelectric conversion unit increases. Therefore, a size of the pixel may increase.

The inventors found that, in some imaging apparatuses, it is difficult to increase saturation charge quantity of pixels. According to some embodiments described herein, in an imaging apparatus which employs a global electronic shutter, saturation charge quantity of pixels may be increased.

An embodiment provides an imaging apparatus including a plurality of pixels and an output line to which signals are supplied from the plurality of pixels. Each of the pixels includes a photoelectric conversion unit, a holding unit which holds charge, and an amplification unit which outputs a signal based on the charge. Each of the pixels further includes a first transfer switch which transfers charge from the photoelectric conversion unit to the holding unit and a second transfer switch which transfers charge from the holding unit to the amplification unit. With this configuration, an imaging operation in which photoelectric conversion periods coincide among the plurality of pixels, that is, the so-called "global electronic shutter", may be operated. An electronic shutter is, for example, defined as to electrically control accumulation of charge that has been generated in response to incident light.

The imaging apparatus performs an operation of outputting a plurality of signals to an output line a plurality of times. In this specification, the operation is referred to as a "one-frame reading operation" or simply referred to as a "one-frame operation". The one-frame reading operation at least includes the following operations.

First, an operation of discharging charge in the photoelectric conversion unit is performed. Specifically, the first and second transfer switches are controlled so as to be simultaneously in an on state. By this control, the charge in the photoelectric conversion units is discharged through the holding units.

At a first time point after the discharge operation, the state of the first transfer switches of the plurality of pixels is changed from the on state to an off state. By this control, the photoelectric conversion units of the plurality of pixels start accumulation of charge. In one embodiment, the first transfer switches of the plurality of pixels in the on state are simultaneously turned off. By this, the photoelectric conversion units of the plurality of pixels may simultaneously start accumulation of charge. Consequently, since accumulation times of the plurality of pixels are the same, image quality may be improved.

The first transfer switch of at least one of the pixels is kept being off from the first time point to a second time point. In the at least one of the pixels, charge generated in this period of time is accumulated in the photoelectric conversion unit. The period from the first time point to the second time point corresponds to a first period. In other words, the first period starts at the first time point and end at the second time point.

Subsequently, the holding units of the plurality of pixels hold charge in a second period from the second time point to a third time point. Here, the holding units hold the charge generated in the first period and the charge generated in the second period. At the third time point, the first transfer switches of the plurality of pixels in an on state are brought into an off state. The first transfer switches of the plurality of pixels in an on state are brought into an off state at the same time.

Thereafter, an output operation is performed in a third period from the third time point to a fourth time point. In the output operation, signals generated based on the charge held in the holding units of the plurality of pixels are output to the output line in turn. In other words, each of the pixels outputs at least one signal in the third period. Specifically, the second transfer switches of the pixels are turned on in the third period in turn. In the individual pixels, the amplification units output signals in a state in which the charge of the holding units is transferred to the amplification units.

The number of signals output in one output operation may be changed depending on a format of an image. In a case of shooting of moving images, for example, it is sufficient that a number of signals corresponding to the number of horizontal lines used for one frame of the image are output. In such an embodiment, the output operation is terminated before signals are output from all the pixels included in the imaging apparatus.

The one-frame reading operation includes the operation from the discharge operation to the output operation described above. Note that the one-frame reading operation may include operations other than the operations described above.

Since the photoelectric conversion units at least accumulate the charge generated in the first period, even if saturation charge quantity of the photoelectric conversion units is small, saturation charge quantity of the pixels may be maintained. Accordingly, with this configuration, the global electronic shutter may be operated while the saturation charge quantity may be maintained. Note that, in some embodiments, the second period in which the holding units of the pixels hold charge is longer than the first period. This is because, in a case where the second period is longer than the first period, the saturation charge quantity of the photoelectric conversion units may be reduced.

In one embodiment, the discharge operation is not performed while the output operation is performed in the frame reading operation performed a plurality of times. By performing this operation, the first transfer switches may have a function of discharging charge supplied from the photoelectric conversion units. Accordingly, the number of elements included in one pixel may be reduced and a size of the photoelectric conversion unit or the holding unit may be increased. Consequently, saturation charge quantity may be improved.

Furthermore, in a state in which both of the first and second transfer switches are in an on state, the first transfer switch is brought into an off state at the first time point, and thereafter, the second transfer switch is brought into an off state. With this configuration, the charge of the first transfer switch may be transferred to the charge holding unit. Therefore, residual charge in the photoelectric conversion unit and the holding unit may be reduced. As a result, noise, such as an image lag, may be reduced.

The second transfer switch which is in the on state may be brought into an off state by the second time point at the latest. With this configuration, charge overflowing from the photoelectric conversion unit in the first period may be held by the holding unit.

Furthermore, each of the pixels may include a reset switch which resets a voltage of an input node of the amplification unit. In one embodiment, in the discharge operation, the reset switch is in an on state while both of the first and second transfer switches are in an on state. With this configuration, a high voltage may be applied between the photoelectric conversion unit and a node to which the charge is discharged. Consequently, residual charge in the photoelectric conversion unit may be reduced. As a result, noise, such as an image lag, may be reduced.

Hereinafter, embodiments of the present disclosure will be described with reference to the accompanying drawings. Embodiments of the present disclosure are limited to the embodiments described below. For example, an embodiment in which a configuration of a portion of one of the embodiments below is added to one of the other embodiments and an embodiment in which a configuration of a portion of one of the embodiments below is replaced by a configuration of a portion of one of the other embodiments are also included in the embodiments of the present disclosure. Furthermore, in the embodiments below, a first conductivity type is an N type and a second conductivity type is a P type. However, the first conductivity type may be a P type and the second conductivity type may be an N type.

First Embodiment

A first embodiment will now be described. FIG. 1 is a diagram illustrating equivalent circuits of pixels of an imaging apparatus. Although four pixels 20 are illustrated in FIG. 1, the imaging apparatus includes more pixels.

Each of the pixels 20 includes a photoelectric conversion unit 1, a holding unit 2, an amplification unit 10, a first transfer switch 4, and a second transfer switch 5. Each of the pixels 20 further includes a reset transistor 9 and a selection transistor 7.

The photoelectric conversion unit 1 generates charge in response to incident light and accumulates the charge generated in response to the incident light. Examples of the photoelectric conversion unit 1 include a photodiode formed on a semiconductor substrate and a photoelectric conversion film formed of organic material or inorganic material which is disposed on the semiconductor substrate. The first transfer switch 4 transfers the charge of the photoelectric conversion unit 1 to the holding unit 2. The holding unit 2 holds the charge generated in response to the incident light in a portion other than the photoelectric conversion unit 1. The second transfer switch 5 transfers the charge of the holding unit 2 to an input node 3 of the amplification unit 10. The reset transistor 9 resets a voltage of the input node 3 of the amplification unit 10. The reset transistor 9 constitutes a reset switch. The selection transistor 7 selects a corresponding one of the pixels 20 which outputs a signal to an output line 8. The amplification unit 10 outputs a signal based on the charge generated in response to the incident light to the output line 8. The amplification unit 10 is a source follower, for example. Furthermore, the first transfer switch 4 and the second transfer switch 5 are MOS transistors.

A control line Tx1 is connected to the first transfer switch 4. A control line Tx2 is connected to the second transfer switch 5. A control line Res is connected to the reset transistor 9. In this embodiment, a plurality of pixels are arranged in a matrix. A common control line is connected to pixels in the same row. Therefore, it is assumed that a control line Tx1(n) and a control line Res(n) are connected to pixels in an n-th row.

With this configuration, charge generated while the holding unit 2 holds charge may be accumulated in the photoelectric conversion unit 1. Accordingly, an imaging operation in which periods of time in which photoelectric conversion is performed coincide among the plurality of pixels, that is, the so-called "global electronic shutter" may be operated.

Figure 2:
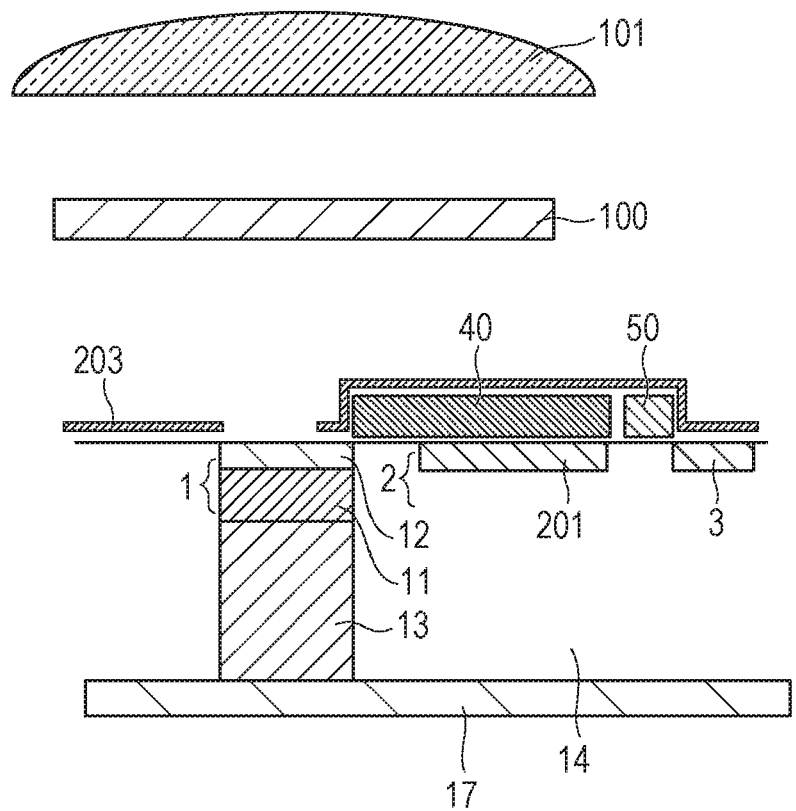
FIG. 2 is a diagram schematically illustrating a cross-section structure of the imaging apparatus.

FIG. 2 is a diagram schematically illustrating a cross-section structure of the imaging apparatus. In FIG. 2, a cross section of one of the pixels 20 is illustrated. Portions having functions the same as those of the first embodiment are denoted by reference numerals the same as those of the first embodiment. Although a surface irradiation type imaging apparatus is illustrated in FIG. 2, a back surface irradiation type imaging apparatus may be employed.

In FIG. 2, an embedded photodiode is used as the photoelectric conversion unit 1. The photoelectric conversion unit 1 includes an N-type semiconductor region 11 and a P-type semiconductor region 12. The N-type semiconductor region 11 and the P-type semiconductor region 12 form a PN junction. The N-type semiconductor region 11 accumulates signal charge (electrons). The P-type semiconductor region 12 enables suppression of noise of an interface.

A P-type semiconductor region 14 is a well. An N-type semiconductor region 13 is disposed below the N-type semiconductor region 11. Impurity concentration of the N-type semiconductor region 13 is lower than that of the N-type semiconductor region 11. Accordingly, charge generated in a deep position is collected in the N-type semiconductor region 11. Here, the N-type semiconductor region 13 may be a P-type semiconductor region 13. A P-type semiconductor region 17 serving as a potential barrier relative to charge is disposed below the N-type semiconductor region 13.

The holding unit 2 includes an N-type semiconductor region 201. The N-type semiconductor region 201 holds charge corresponding to a signal. Impurity concentration of the N-type semiconductor region 201 is higher than that of the N-type semiconductor region 11.

A gate electrode 40 constitutes a gate of the first transfer switch 4. A gate electrode 50 constitutes a gate of the second transfer switch 5. A portion of the gate electrode 40 overlaps on the N-type semiconductor region 201 through a gate insulation film. A hole may be induced on a surface of the N-type semiconductor region 201 by applying a negative voltage to the gate electrode 40. By this, noise generated in an interface may be suppressed.

Light to the holding unit 2 is blocked by a light shielding unit 203. The light shielding unit 203 is formed by metal, such as tungsten or aluminum, through which visible light is difficult to pass. A color filter 100 and a micro lens 101 are disposed on an opening of the light shielding unit 203.

The photoelectric conversion unit 1 and the holding unit 2 are disposed on the semiconductor substrate. In this embodiment, an area of orthogonal projection of the photoelectric conversion unit 1 to a surface which is parallel to a surface of the semiconductor substrate is smaller than an area of orthogonal projection of the holding unit 2 to the same surface. With this configuration, the saturation charge quantity of the pixels may be effectively increased while reduction of noise is realized.

To increase the saturation charge quantity of the pixels, in one embodiment, the holding units 2 have a large saturation charge quantity. When the impurity concentration of the N-type semiconductor region 201 in the holding unit 2 is increased or the area of the N-type semiconductor region 201 is increased in a plan view, the saturation charge quantity of the holding unit 2 may be increased. However, when the impurity concentration of the N-type semiconductor region 201 is high, leakage current or the like is likely to be large, and therefore, noise may be increased. Therefore, the saturation charge quantity may be increased by increasing the area of the N-type semiconductor region 201 in a plan view while the impurity concentration of the N-type semiconductor region 201 is suppressed.

As described above, when the areas of the holding units 2 in a plan view, that is, the areas of the orthogonal projection of the holding units 2 are increased, the saturation charge quantity of the pixels may be increased while noise is reduced. In this case, areas of the photoelectric conversion units 1 are relatively likely to be small in a plan view, and it is difficult to increase the saturation charge quantity of the photoelectric conversion units 1. Accordingly, even though the saturation charge quantity of the photoelectric conversion units 1 is small, the saturation charge quantity of the pixels is more efficiently maintained.

Figure 3:
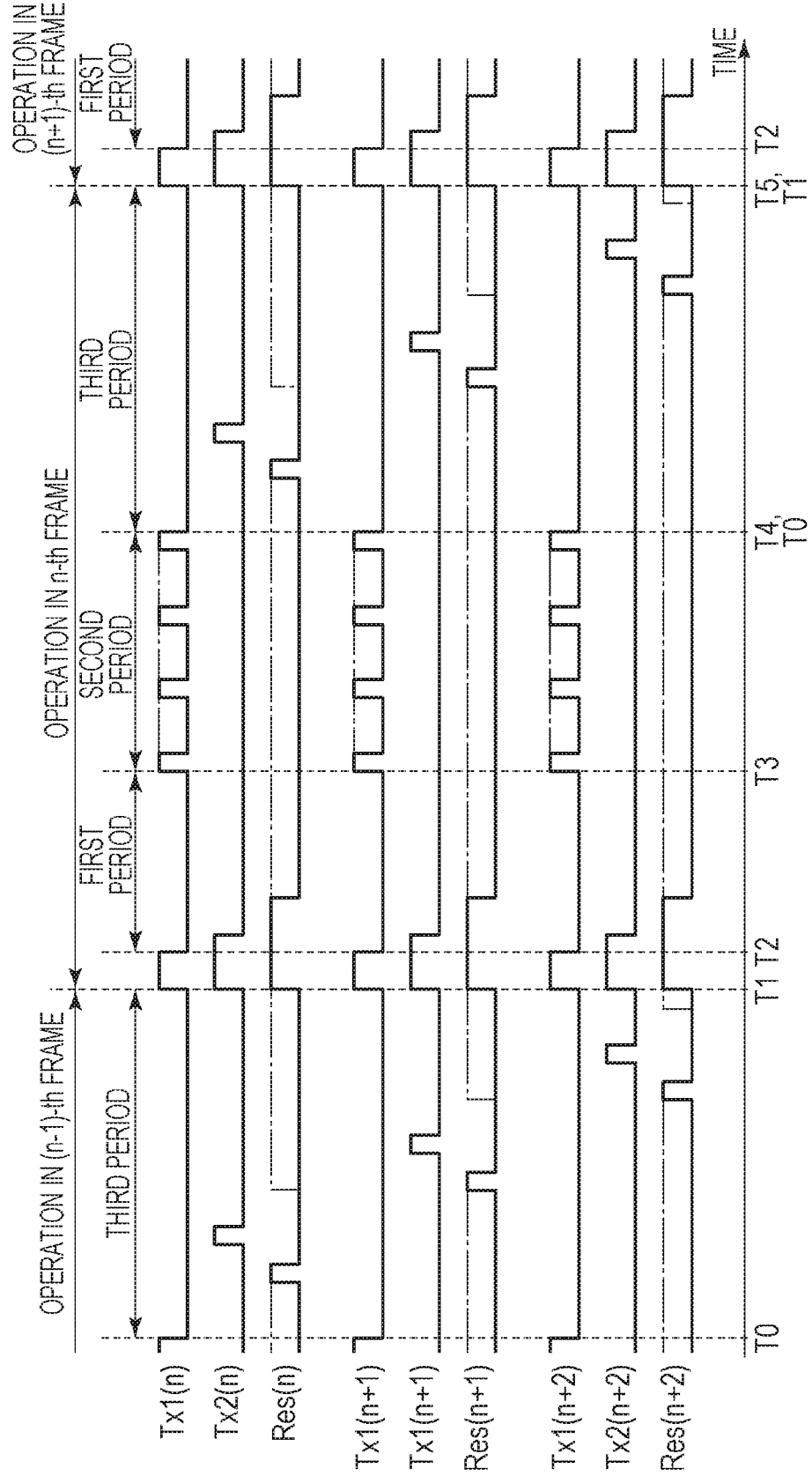
FIG. 3 is a diagram illustrating driving pulses of the imaging apparatus.

A method for driving the imaging apparatus of this embodiment will now be described. FIG. 3 is a diagram schematically illustrating driving pulses according to this embodiment. In FIG. 3, driving pulses supplied to the control lines Tx1 of the first transfer switches 4, the control lines Tx2 of the second transfer switches 5, and the control lines Res of the reset transistors 9 in the pixels in the n-th row to (n+2)-th row are illustrated by solid lines. Dashed lines denote modifications of the driving pulses. When the driving pulse is in a high level, a corresponding transistor or a corresponding switch is turned on. When the driving pulse is in a low level, a corresponding transistor or a corresponding switch is turned off. The high level or the low level is determined in accordance with conductive types of the transistors and the switches. A control unit included in the imaging apparatus supplies the driving pulses. A logic circuit, such as a shift register or an address decoder, is used as the control unit.

In FIG. 3, an operation from a time point T1 to a time point T5 corresponds to a reading operation of an n-th frame. First, the output operation is performed on an (n-1)-th frame which is a preceding frame in a period from a time point T0 to the time point T1. In the output operation, a plurality of signals are supplied from the plurality of pixels 20 to the output line 8 in turn.

At the time point T1, the first and second transfer switches 4 and 5 and the reset transistor 9 are turned on. Both of the first and second transfer switches 4 and 5 are turned on, and the charge of the photoelectric conversion unit 1 is discharged through the holding unit 2. Specifically, the discharge operation is performed.

Note that the first transfer switch 4, the second transfer switch 5, and the reset transistor 9 in an off state may be brought into an on state at different timings. For example, the first transfer switch 4 in the off state may be brought into an on state before the second transfer switch 5 in the off state is brought to an on state. Alternatively, the second transfer switch 5 in the off state may be brought into an on state before the first transfer switch 4 in the off state is brought to an on state. In FIG. 3, modifications of the driving pulses supplied to the reset transistors 9 are denoted by the dashed lines. The reset transistor 9 is turned off at least when outputting a signal to the output line 8. The reset transistor 9 may be in an off state when the first and second transfer switches 4 and 5 are in an on state. In any configuration, both of the first and second transfer switches 4 and 5 are turned on so that the charge of the photoelectric conversion unit 1 is discharged through the holding unit 2.

At a time point T2, the first transfer switch 4 in the on state is brought into an off state. Accordingly, exposure is started. The exposure means that charge generated by photoelectric conversion is accumulated or held as a signal. Here, the photoelectric conversion unit 1 starts accumulation of the charge when the first transfer switch 4 in the on state is brought into an off state.

After the first transfer switch 4 in the on state is brought into the off state at the time point T2, the second transfer switch 5 in the on state is brought into an off state. By this, residual charge in the holding unit 2 may be reduced by turning off the first transfer switch 4 and the second transfer switch 5 in turn. Thereafter, the reset transistor 9 in the on state is brought into an off state.

From the time point T2 to a time point T3 after the first period is elapsed, the first transfer switch 4 is maintained in the off state. In this embodiment, the first transfer switches 4 of all the pixels are maintained in the off state. However, the first transfer switch 4 of at least one of the pixels is maintained in an off state from the time point T1 to the time point T2.

The time point T3 is reached when the first period is elapsed after the time point T2. Specifically, the first period corresponds to a period from the time point T2 to the time point T3. In the first period, the charge generated in the first period is accumulated in the photoelectric conversion unit 1.

At the time point T3, the first transfer switch 4 in an off state is turned on. By this, the charge of the photoelectric conversion unit 1 is transferred to the holding unit 2. Specifically, the charge generated in the first period is held by the holding unit 2 after the time point T3. In this embodiment, the off state of the first transfer switches 4 of all the pixels are simultaneously changed to an on state. However, it is sufficient that the first transfer switches 4 of the plurality of pixels are in an on state by the time point T3, and timings of the change may be shifted from one another.

Thereafter, from the time point T3 to a time point T4 after the second period is elapsed, the holding unit 2 holds the charge generated in the first period and the charge generated in the second period. Specifically, the second transfer switches 5 of the plurality of pixels 20 are maintained in an off state from the time point T3 to the time point T4.

In this embodiment, the second period includes a period of time in which the first transfer switches 4 are in an on state and a period of time in which the first transfer switches 4 are in an off state. Since the first transfer switches 4 are in the off state in a portion of the second period, noise may be reduced.

Furthermore, a state of the first transfer switches 4 is changed from the off state to the on state a plurality of times in the second period. In one embodiment, the number of times in which the first transfer switch 4 in the off state is turned on in the second period is larger than a rate of saturation charge quantity of the holding unit 2 to saturation charge quantity of the photoelectric conversion unit 1. By this, saturation charge quantity of the pixels 20 may be improved.

A period of time in which the charge is transferred from the photoelectric conversion unit 1 to the holding unit 2, that is, a period of time in which the first transfer switch 4 is in the on state, may be arbitrarily set. The first transfer switch 4 may be constantly maintained in the on state in the second period. For example, in FIG. 3, driving pulses denoted by the dashed lines are supplied to the first transfer switches 4 through the control lines Tx1. In this case, charge generated in the second period is immediately transferred to the holding units 2.

At the time point T4, the first transfer switches 4 of the pixels in the on state in all the rows are simultaneously brought into an off state. By this, an exposure period in the one-frame reading operation is terminated. As illustrated in FIG. 3, exposure periods of all the pixels match one another. Specifically, in all the pixels, exposure is started at the time point T2 and terminated at the time point T4.

Next, the charge in the holding units 2 is read to the input nodes 3 of the amplification units 10 in turn in a third period from the time point T4 to a time point T5. Furthermore, an output operation of successively outputting signals from the plurality of pixels 20 to the output line 8 is performed in the third period from the time point T4 to the time point T5. Specifically, when the second transfer switches 5 in the n-th row are turned on, the charge of the holding units 2 of the pixels in the n-th row is transferred to the input nodes 3. Voltages of the input nodes 3 are changed in accordance with capacitances of the input nodes 3 and an amount of the transferred charge. The amplification units 10 output signals based on the charge generated in response to the incident light to the output line 8. Next, the same operation is performed on pixels in the (n+1)-th row. This operation is performed on pixels in a first row to pixels in a last row.

Figure 4:
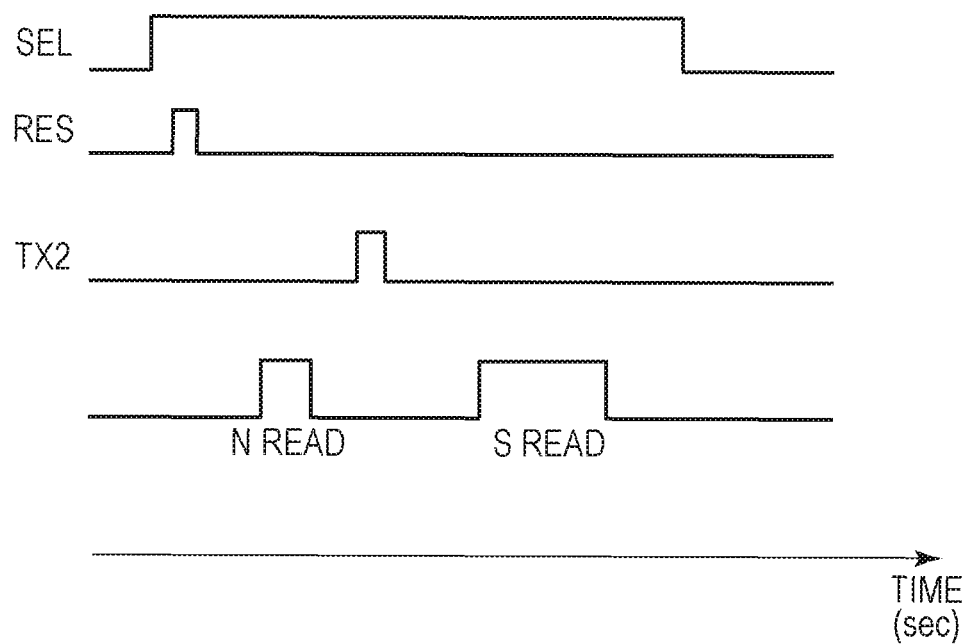
FIG. 4 is a diagram illustrating driving pulses of the imaging apparatus.

Next, the operation of reading a signal from one pixel will be briefly described. FIG. 4 is a diagram schematically illustrating driving pulses used in the imaging apparatus. In FIG. 4, a driving pulse SEL to be supplied to the selection transistor 7, a driving pulse RES to be supplied to the reset transistor 9, and a driving pulse TX2 to be supplied to the second transfer switch 5 are illustrated. When a driving pulse is in a high level, a corresponding transistor or a corresponding switch is turned on. When a driving pulse is in a low level, a corresponding transistor or a corresponding switch is turned off.

In accordance with the driving pulses illustrated in FIG. 4, selection of pixels, resetting, reading of a noise signal (N read), transfer of charge, and reading of an optical signal (S read) are performed. An output signal may be subjected to AD conversion in an outside of the imaging apparatus. The AD conversion may be performed in an inside of the imaging apparatus.

At the time point T5, the first and second transfer switches 4 and 5 and the reset transistor 9 are turned on. Both of the first and second transfer switches 4 and 5 are turned on, and the charge of the photoelectric conversion unit 1 is discharged through the holding unit 2. That is, the discharge operation is performed.

Here, an operation after the time point T5 onwards corresponds to a reading operation performed on a next frame, that is, the (n+1)-th frame. Specifically, the operation in a period from the time point T1 to the time point T5 is repeatedly performed after the time point T5. In this way, an operation of outputting a plurality of signals from the plurality of pixels 20 to the output line 8 is performed a plurality of times.

In this embodiment, a discharge operation in the reading operation on the (n+1)-th frame is performed after the output operation in the reading operation on the n-th frame is terminated. With this configuration, residual charge in the photoelectric conversion units 1 may be reduced without losing signals of the preceding frame. As a result, noise may be reduced.

Figure 5:
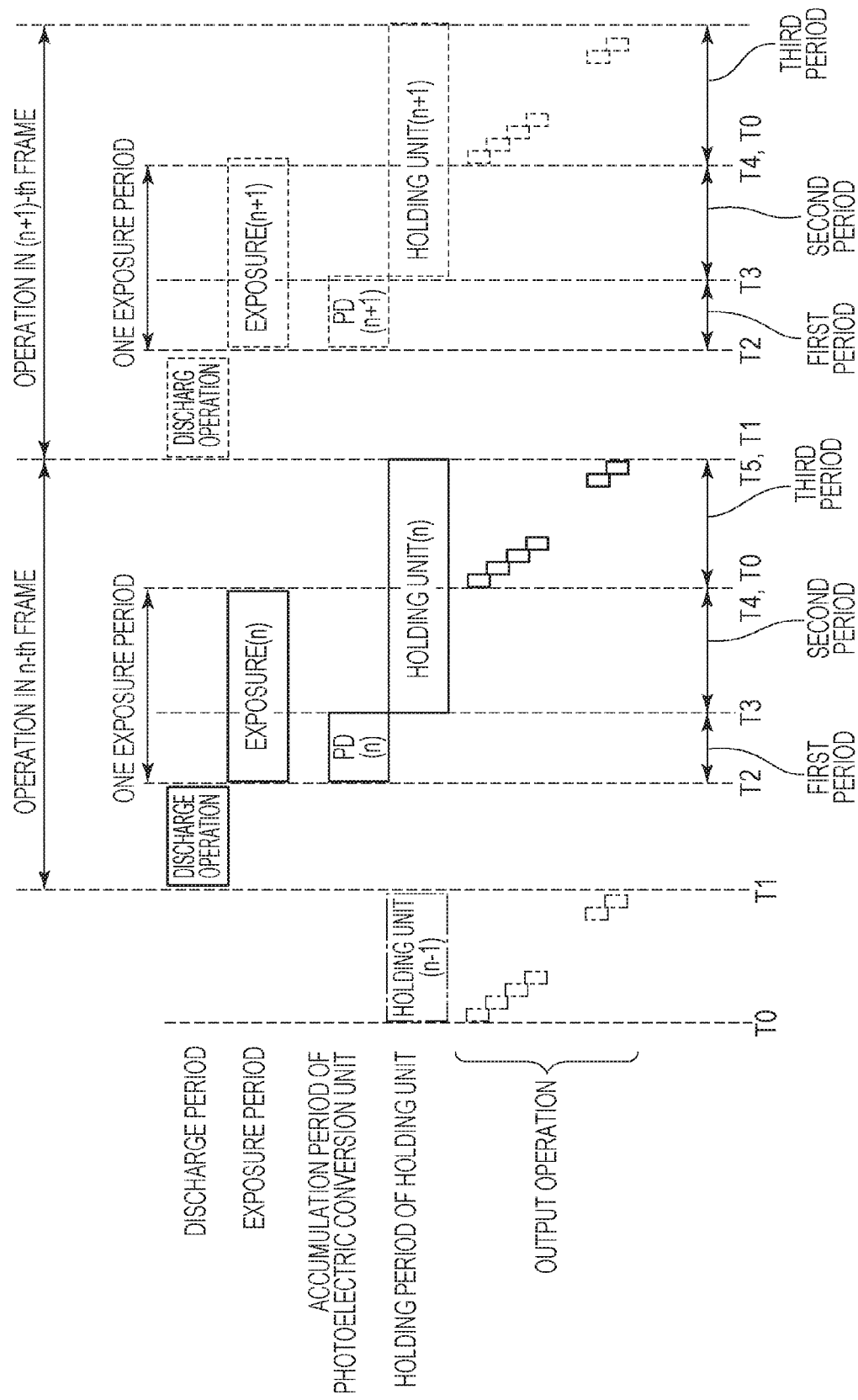
FIG. 5 is a diagram schematically illustrating an operation of the imaging apparatus.

Next, an effect of this embodiment will be described. FIG. 5 is a diagram schematically illustrating an operation of the imaging apparatus. In FIG. 5, the reading operation performed on the n-th frame and the (n+1)-th frame is illustrated. The reading operation performed on the n-th frame is denoted by solid lines and the reading operation performed on the (n+1)-th frame is denoted by dotted lines.

In FIG. 5, exposure periods of the frames, periods of time in which the photoelectric conversion units 1 accumulate charge, and periods of time in which the holding units 2 hold charge are illustrated. According to FIG. 5, an output operation of outputting a plurality of signals from the plurality of pixels 20 is performed in the third period.

As illustrated in FIG. 5, the photoelectric conversion units 1 accumulate charge in the first period and the holding units 2 hold the charge in the second period. Accordingly, even when saturation charge quantity of the photoelectric conversion units 1 is small, saturation charge quantity of the pixels may be increased.

The saturation charge quantity of the pixels corresponds to the maximum value of charge quantity which may be used as a signal in charge generated in one exposure. Saturation charge quantity of the photoelectric conversion units 1 and saturation charge quantity of the holding units 2 correspond to maximum values of amounts of charge allowed to be accumulated in the photoelectric conversion units 1 and maximum values of amounts of charge allowed to be stored in the holding units 2.

One exposure period is obtained as a sum of the first period and the second period. Here, the photoelectric conversion unit 1 at least accumulates charge generated in the first period. Normally, an amount of charge generated in the first period is smaller than that generated in one exposure period, and accordingly, saturation charge quantity of the photoelectric conversion unit 1 may be reduced.

As illustrated in FIG. 5, in this embodiment, the second period in which the holding units 2 hold the charge is longer than the first period. Therefore, saturation charge quantity of the photoelectric conversion units 1 may be further reduced. However, the first period may be equal to the second period, or the first period may be longer than the second period.

In FIG. 5, a case where the reading operation is successively performed from the first row is illustrated as an example. However, order of the reading operation is not limited to this example. The reading operation is performed at least once on each of the pixels included in one frame in the first period. Furthermore, in at least some of the pixels, a period of time from when the holding units 2 start holding of charge in a certain frame to when the holding units 2 starts holding of charge in a next frame is equal to the exposure time.

In one embodiment, a ratio of the first period to a sum of the first period and the second period is substantially the same as a ratio of the saturation charge quantity of the photoelectric conversion unit 1 to saturation charge quantity of the holding unit 2. More specifically, a saturation charge quantity $A_1$ of the photoelectric conversion unit 1, a saturation charge quantity $A_2$ of the holding unit 2, a first period $P_1$, and a second period $P_2$ satisfy Expression (1) below. Here, a sum of the first period $P_1$ and the second period $P_2$ indicates one exposure period $P_1+P_2$.

$$\frac{P_1 - 0.5 \times P_1}{(P_1 + P_2)} \leq \frac{A_1}{A_2} \leq \frac{P_1 + 0.5 \times P_2}{(P_1 + P_2)} \quad (1)$$

In one embodiment, the ratio of the first period to the sum of the first period and the second period is equal to the ratio of the saturation charge quantity $A_1$ of the photoelectric conversion unit 1 to the saturation charge quantity $A_2$ of the holding unit 2. Specifically, the values $A_1$, $A_2$, $P_1$, and $P_2$ satisfy Expression (2) below.

$$\frac{A_1}{A_2} = \frac{P_1}{(P_1 + P_2)} \quad (2)$$

In this embodiment, a ratio of one exposure period to the first period is 4:1. Specifically, the first period corresponds to a quarter of one exposure period. In a case where a moving image of 60 frames per second is to be captured, for example, the exposure period corresponds to 1/60 seconds and the first period corresponds to 1/240 seconds.

Therefore, in one embodiment, the ratio of the saturation charge quantity of the photoelectric conversion unit 1 to the saturation charge quantity of the holding unit 2 is close to 1:4. This is because, although the holding unit 2 holds all charge generated in one exposure period, the photoelectric conversion unit 1 holds at least a quarter of the charge. Specifically, in a case where the saturation charge quantity of the holding unit 2 is 40000 electrons, the saturation charge quantity of the photoelectric conversion unit 1 is in a range equal to or larger than 5000 electrons and equal to or smaller than 25000 electrons. In one embodiment, the saturation charge quantity of the photoelectric conversion unit 1 is 10000 electrons.

This ratio of the saturation charge quantity represented by Expression (1) above enables optimization of sizes of the photoelectric conversion unit 1 and the holding unit 2.

Furthermore, in a case where a configuration in which the holding unit 2 holds charge overflowing from the photoelectric conversion unit 1 is employed, the values $A_1$, $A_2$, $P_1$, and $P_2$ may satisfy Expression (3) below.

$$\frac{P_1 - 0.5 \times P_1}{(P_1 + P_2)} \leq \frac{A_1}{A_2} < \frac{P_1}{(P_1 + P_2)} \quad (3)$$

Specifically, in a case where the saturation charge quantity of the holding unit 2 is 40000 electrons, the saturation charge quantity of the photoelectric conversion unit 1 is in a range equal to or larger than 5000 electrons and smaller than 10000 electrons. With this configuration, the charge overflowing from the photoelectric conversion unit 1 may be held by the holding unit 2, and accordingly, mixing of charge may be reduced.

On the other hand, in a case where the values $A_1$, $A_2$, $P_1$, and $P_2$ satisfy Expression (4) below, the photoelectric conversion unit 1 has a margin of the saturation charge quantity, and accordingly, overflow of charge may be reduced.

$$\frac{P_1}{(P_1 + P_2)} < \frac{A_1}{A_2} \leq \frac{P_1 + 0.5 \times P_2}{(P_1 + P_2)} \quad (4)$$

Note that the imaging apparatus of this embodiment may have an operation mode for performing rolling shutter. In the operation mode for the rolling shutter, the photoelectric conversion units 1 of the plurality of pixels successively start accumulation of charge. Thereafter, the first transfer switches 4 of the plurality of pixels are successively turned on. The imaging apparatus of this embodiment may further have an operation mode for global electronic shutter employing another method. Examples of the global electronic shutter employing another method include an operation in which a period of time in which the photoelectric conversion units 1 accumulate charge becomes equal to the exposure period.

As described above, according to the imaging apparatus of this embodiment, the global electronic shutter may be operated while the saturation charge quantity is improved.

Second Embodiment

Next, a second embodiment will be described. In this embodiment, a configuration of holding units is different from that of the first embodiment. Therefore, only portions different from those of the first embodiment are described and descriptions of portions the same as those of the first embodiment are omitted.

An equivalent circuit of this embodiment is the same as that of the first embodiment. Specifically, FIG. 1 is a diagram illustrating equivalent circuits of pixels of an imaging apparatus of this embodiment. Since a description of FIG. 1 is the same as that of the first embodiment, the description is omitted.

A driving method of this embodiment is the same as that of the first embodiment. Specifically, FIGS. 3 and 4 are diagrams schematically illustrating driving pulses according to this embodiment. FIG. 5 is a diagram schematically illustrating an operation of the imaging apparatus of this embodiment. Since descriptions of FIGS. 3 to 5 are the same as those of the first embodiment, the descriptions are omitted here.

Figure 6:
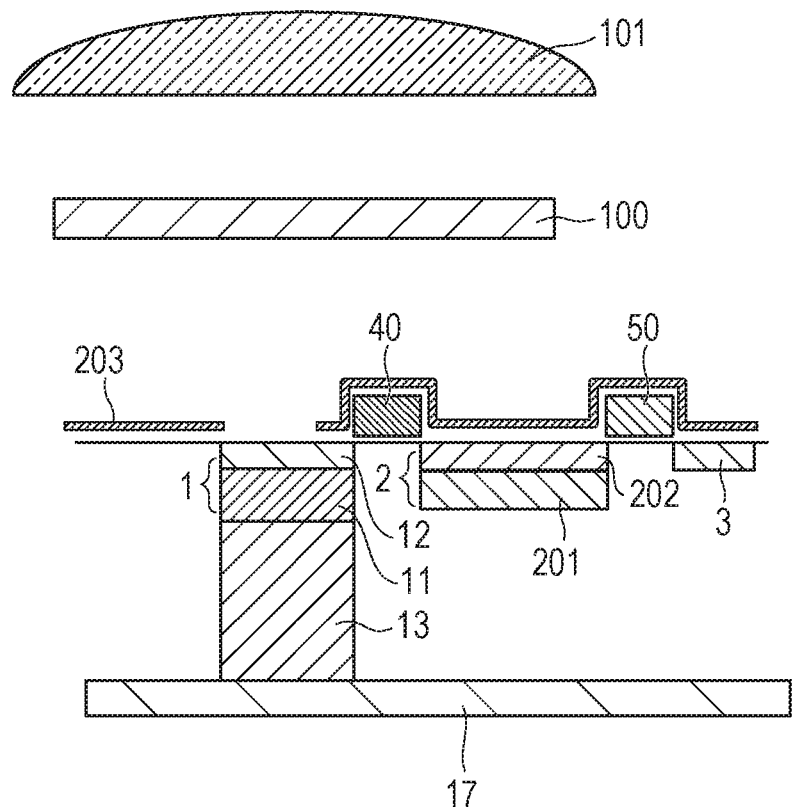
FIG. 6 is a diagram schematically illustrating a cross-section structure of the imaging apparatus.

FIG. 6 is a diagram schematically illustrating a cross-section structure of the imaging apparatus. In FIG. 6, a cross section of a pixel is illustrated. Portions having functions the same as those of FIGS. 1 to 5 are denoted by reference numerals the same as those of FIGS. 1 to 5.

A holding unit 2 includes an N-type semiconductor region 201 and a P-type semiconductor region 202. The P-type semiconductor region 202 is disposed on the N-type semiconductor region 201. The P-type semiconductor region 202 enables suppression of noise of an interface.

Furthermore, a gate electrode 40 of a first transfer switch 4 does not extend on the N-type semiconductor region 201. Therefore, restriction of layout is eased, and a degree of freedom of design may be enhanced.

As described above, according to this embodiment, in addition to the effect of the first embodiment, noise may be reduced.

Third Embodiment

Next, a third embodiment will be described. This embodiment is different from the first and second embodiments in that each pf pixels has a discharge switch. Furthermore, this embodiment is different from the first and second embodiments in that a waveguide is disposed on a photoelectric conversion unit. Therefore, only portions different from those of the first and second embodiments are described and descriptions of portions the same as those of one of the first and second embodiments are omitted.

Figure 7:
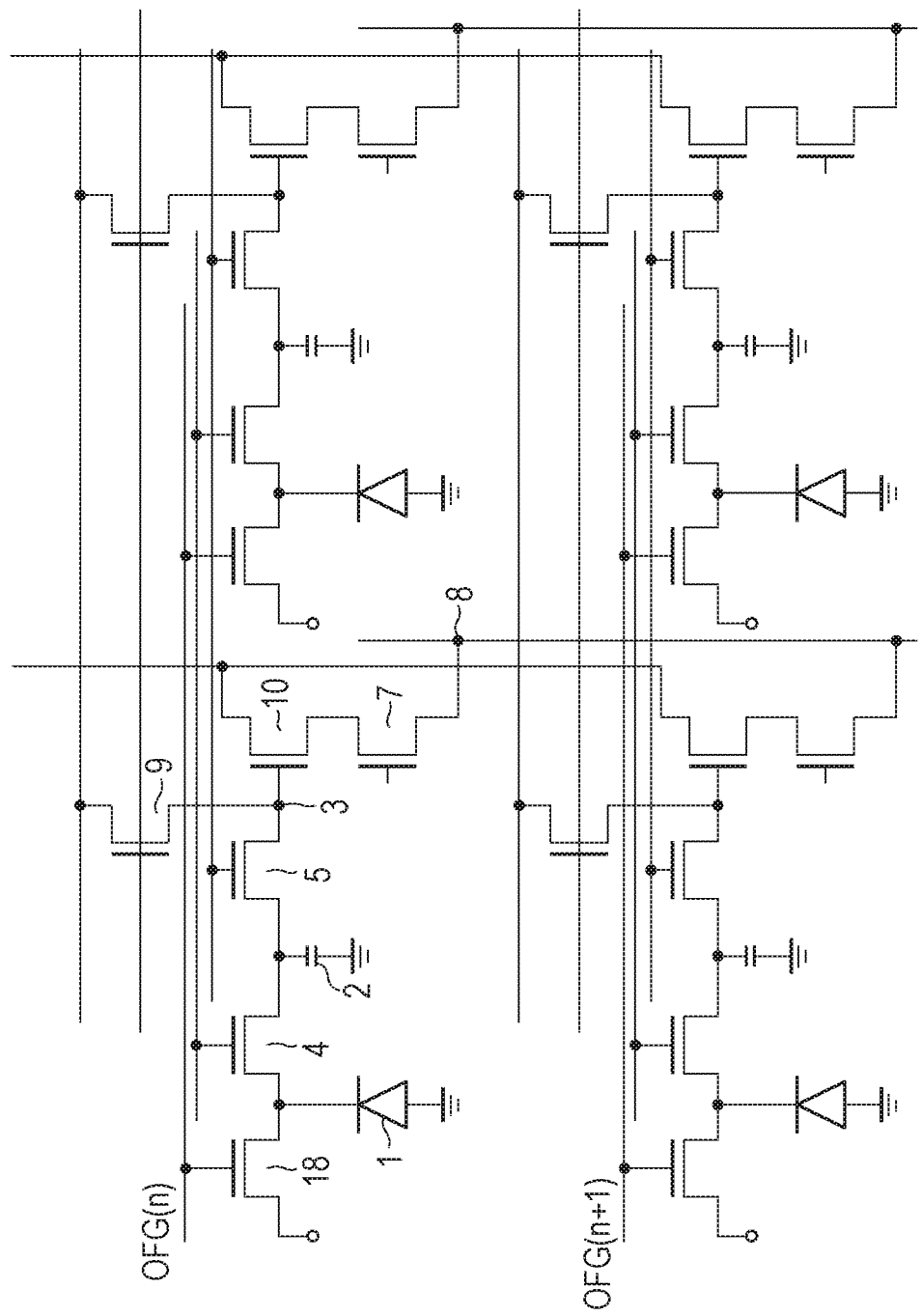
FIG. 7 is a diagram illustrating an equivalent circuit of an imaging apparatus.

FIG. 7 is a diagram illustrating equivalent circuits of pixels of an imaging apparatus. Portions the same as those of FIG. 1 are denoted by reference numerals the same as those of FIG. 1. Note that, for simplicity of the drawings, reference numerals of control lines Tx1, Tx2, and Res are omitted. The control lines Tx1, Tx2, and Res have configurations the same as those of the first embodiment.

Each of the pixels has a discharge switch 18. The discharge switch 18 discharges charge of a photoelectric conversion unit 1 to a power source node, such as an overflow drain. A control line OFG is connected to the discharge switch 18. The discharge switch 18 is a MOS transistor, for example.

In this embodiment, in at least a portion of a third period in which an output operation of outputting a plurality of signals from a plurality of pixels 20 to an output line 8, the discharge switches 18 are in an on state. Here, the discharge switches 18 may discharge charge of the photoelectric conversion units 1 through paths different from paths of discharge of charge by first transfer switches 4. Accordingly, noise generated due to mixing of charge generated in the third period into the holding units 2 may be reduced. As a result, image quality may be improved.

Figure 8:
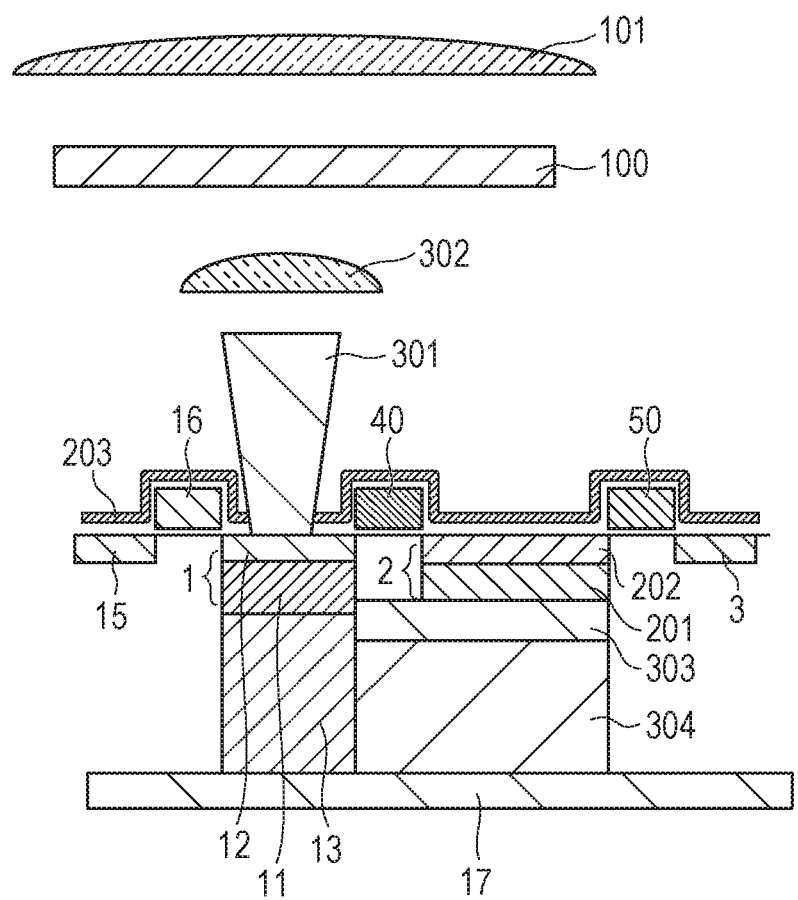
FIG. 8 is a diagram schematically illustrating a cross-section structure of the imaging apparatus.

FIG. 8 is a diagram schematically illustrating a cross-section structure of the imaging apparatus. Portions having functions the same as those of FIGS. 1 and 2 are denoted by reference numerals the same as those of FIGS. 1 and 2. As with the second embodiment, FIG. 8 is a diagram illustrating a case where the holding unit 2 includes a P-type semiconductor region 202 as an example. As illustrated in FIG. 1, the holding unit 2 may not include the P-type semiconductor region 202.

The discharge switch 18 includes an overflow control electrode 16 and an overflow drain 15. Charge of the photoelectric conversion unit 1 is discharged to the overflow drain 15 in accordance with a voltage supplied to the overflow control electrode 16. A predetermined voltage is supplied to the overflow drain 15. Light to the overflow control electrode 16 and the overflow drain 15 is blocked by a light shielding unit 203.

In this embodiment, a waveguide 301 is provided so as to correspond to a photoelectric conversion unit 1. The waveguide 301 guides incident light to the photoelectric conversion unit 1. By this, sensitivity may be improved. In particular, degradation of sensitivity of light which is obliquely incident may be reduced.

The waveguide 301 has a general structure. In this embodiment, the waveguide 301 is formed by a material having a refractive index higher than that of a surrounding insulation film. An interlayer insulation film formed by a silicon oxide film is used as the surrounding insulation film, and a silicon nitride film is used as the waveguide 301, for example. Alternatively, a reflection layer is provided so as to surround the waveguide 301. The waveguides 301 may be disposed for the individual photoelectric conversion units 1 of all pixels or for photoelectric conversion units 1 of some of the pixels.

An interlayer lens 302 may be disposed between a color filter 100 and the waveguide 301. The interlayer lens 302 collects light which passes through the color filter 100 in the waveguide 301. Use of the interlayer lens 302 may improve sensitivity. In particular, degradation of sensitivity of light which is obliquely incident may be reduced.

As described above, according to this embodiment, in addition to the effect of the first embodiment, noise may be reduced. Furthermore, according to this embodiment, in addition to the effect of the first embodiment, sensitivity may be improved. In particular, the effect of improvement of the sensitivity is remarkable when an area of the photoelectric conversion unit 1 is reduced in a plan view so that an area of the holding unit 2 is increased in the plan view.

Note that the imaging apparatus of this embodiment includes both of the discharge switches 18 and the waveguides 301. However, the imaging apparatus may only include the discharge switches 18 or the waveguides 301.

Fourth Embodiment

Figure 9:
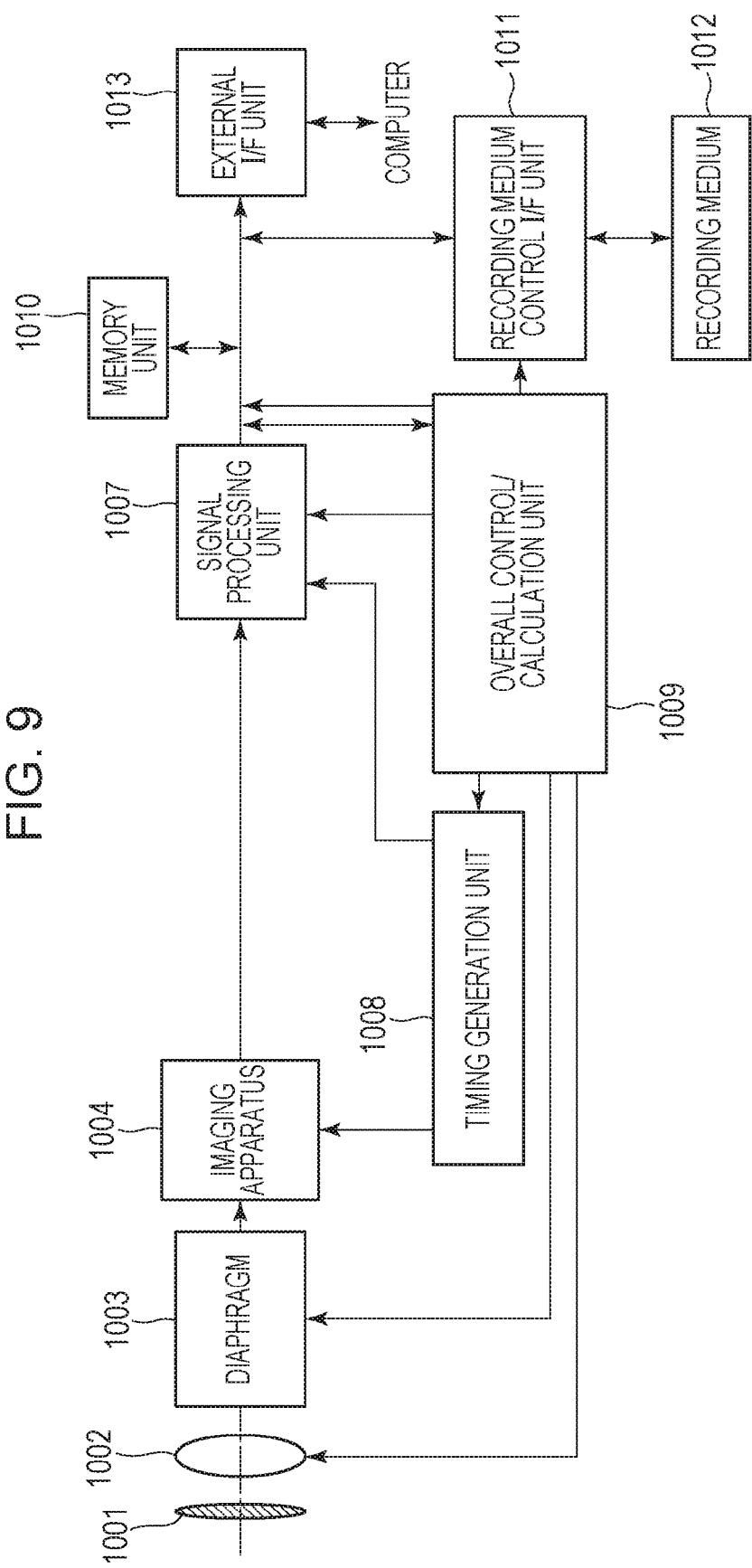
FIG. 9 is a block diagram illustrating a configuration of an imaging system.

An embodiment of an imaging system according to the present disclosure will be described. Examples of the imaging system include a digital still camera, a digital camcorder, a copier, a facsimile, a cellular phone, an on-vehicle camera, and an observatory. Furthermore, a camera module including an optical system, such as a lens, and an imaging apparatus is also included in the imaging system. FIG. 9 is a block diagram illustrating a digital still camera serving as an example of an imaging system.

In FIG. 9, a barrier 1001 protects a lens, the lens 1002 forms an optical image of an object on an imaging apparatus 1004, and a diaphragm 1003 changes quantity of light which has passed the lens 1002. An imaging apparatus described in the foregoing embodiments is denoted by a reference numeral 1004, and the imaging apparatus 1004 converts an optical image formed by the lens 1002 into image data. Here, it is assumed that an AD conversion unit is formed on a semiconductor substrate of the imaging apparatus 1004. A signal processing unit 1007 performs various types of correction on imaging data output from the imaging apparatus 1004 and compresses imaging data. Furthermore, in FIG. 9, a timing generation unit 1008 outputs various timing signals to the imaging apparatus 1004 and the signal processing unit 1007, and an overall control/calculation unit 1009 controls entire digital still camera. A frame memory unit 1010 temporarily store image data, an interface unit 1011 performs recording and reading on a recording medium, and a detachable recording medium 1012 is a semiconductor memory or the like for recording or reading imaging data. An interface unit 1013 is used to communicate with external computers and the like. Here, a timing signal or the like may be input from an outside of an imaging system which at least includes the imaging apparatus 1004 and the signal processing unit 1007 which processes an imaging signal output from the imaging apparatus 1004.

In this embodiment, a structure in which the imaging apparatus 1004 and the AD conversion unit are disposed on the same semiconductor substrate has been described. However, the imaging apparatus 1004 and the AD conversion unit may be disposed on different semiconductor substrates. Furthermore, the imaging apparatus 1004 and the signal processing unit 1007 may be disposed on the same semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-079476, filed Apr. 8, 2015, which is hereby incorporated by reference herein in its entirety.

What is claimed is:

1. A method for driving an imaging apparatus including a plurality of pixels each of which includes a photoelectric conversion unit which generates charge in response to incident light and accumulates the charge, a holding unit which holds the charge, an amplification unit which outputs a signal in accordance with the charge, a first transfer switch which transfers the charge from the photoelectric conversion unit to the holding unit, a second transfer switch which transfers the charge from the holding unit to the amplification unit, and an output line which outputs a plurality of signals supplied from the plurality of pixels, the method comprising:
performing an operation of outputting the plurality of signals to the output line a plurality of times,
wherein in each operation performed a plurality of times,
both of the first and second transfer switches are brought into an on state so that a discharge operation of discharging charge of the photoelectric conversion unit through the holding unit is performed,
the first transfer switches of the plurality of pixels in an on state are brought into an off state at a first time point after the discharge operation so that accumulation of the charge is started in the photoelectric conversion units of the plurality of pixels,
from the first time point to a second time point, the first transfer switch of at least one of the plurality of pixels is maintained in an off state and the photoelectric conversion unit of the at least one of the pixels accumulates charge generated in the first period from the first time point to the second time point,
from the second time point to a third time point, the holding units of the plurality of pixels hold charge generated in the first period and charge generated in a second period from the second time point to the third time point,
a state of the first transfer switches of the plurality of pixels is changed from an on state to an off state at the third time point, and
the second transfer switches of the plurality of pixels are successively turned on and an output operation of successively outputting the plurality of signals to the output line is performed in a third period from the third time point to a fourth time point,
wherein the operation performed a plurality of times includes a first operation and a second operation to be performed after the first operation, and
wherein the discharge operation in the second operation is performed after the output operation in the first operation is terminated.

2. The method according to claim 1, wherein, in a state in which the first and second transfer switches are in an on state, the first transfer switch which is in the on state is brought into an off state at the first time point and thereafter, the second transfer switch which is in the on state is brought into an off state.

3. The method according to claim 1, wherein the discharge operation is not performed in the third period in which the output operation is performed in the operation performed a plurality of times.

4. The method according to claim 1, wherein the discharge operation is not performed in the second period in the operation performed a plurality of times.

5. The method according to claim 1,
wherein each of the plurality of pixels includes a reset switch configured to reset a voltage of an input node of the amplification unit, and
wherein, in the discharge operation, the reset switch is in an on state while both of the first and second transfer switches are in an on state.

6. The method according to claim 1,
wherein the first transfer switches of the plurality of pixels are turned on by the second time point at the latest, and
wherein the first transfer switches are in an off state in a portion in the second period.

7. The method according to claim 6,
wherein the change of the state of the first transfer switches from the off state to the on state is performed in the second period, and
wherein a number of times in which the first transfer switch in the off state is turned on in the second period is larger than a rate of saturation charge quantity of the holding unit to saturation charge quantity of the photoelectric conversion unit.

8. The method according to claim 6,
wherein from the first time point to the second time point, the first transfer switches of the plurality of pixels are maintained in an off state and the photoelectric conversion units of the plurality of pixels accumulate charge generated in the first period, and
wherein the state of the first transfer switches of the plurality of pixels are changed from the off state to an on state at the second time point.

9. The method according to claim 1,
wherein each of the plurality of pixels has a discharge switch which discharges charge of the photoelectric conversion unit, and
wherein the discharge switch is in an on state in at least a portion in the third period.

10. The method according to claim 9, wherein the discharge switch discharges charge of the photoelectric conversion unit through a path different from a path of discharge of charge by first transfer switch.

11. The method according to claim 1, wherein the second period is longer than the first period.

12. The method according to claim 1, wherein a saturation charge quantity $A_1$ of the photoelectric conversion unit, a saturation charge quantity $A_2$ of the holding unit, the first period $P_1$, and the second period $P_2$ satisfy the following relationship:

$$\frac{P_1 - 0.5 \times P_1}{(P_1 + P_2)} \le \frac{A_1}{A_2} \le \frac{P_1 + 0.5 \times P_2}{(P_1 + P_2)}.$$

13. The method according to claim 1, wherein a saturation charge quantity $A_1$ of the photoelectric conversion unit, a saturation charge quantity $A_2$ of the holding unit, the first period $P_1$, and the second period $P_2$ satisfy the following relationship:

$$\frac{A_1}{A_2} = \frac{P_1}{(P_1 + P_2)}.$$

14. The method according to claim 1, wherein the second transfer switches of the plurality of pixels are maintained in an off state from the first time point to the second time point.

15. An imaging apparatus comprising:
a plurality of pixels each of which includes a photoelectric conversion unit which generates charge in response to incident light and accumulate the charge, a holding unit which holds the charge, an amplification unit which outputs a signal in accordance with the charge, a first transfer switch which transfers the charge from the photoelectric conversion unit to the holding unit, and a second transfer switch which transfers the charge from the holding unit to the amplification unit; and
an output line to which signals are output from the pixels, wherein an operation of outputting the plurality of signals to the output line is performed a plurality of times, wherein in each operation performed a plurality of times,
both of the first and second transfer switches are brought into an on state so that a discharge operation of discharging charge of the photoelectric conversion unit through the holding unit is performed, the first transfer switches of the plurality of pixels in an on state are brought into an off state at a first time point after the discharge operation so that accumulation of the charge is started in the photoelectric conversion units of the plurality of pixels, from the first time point to a second time point, the first transfer switch of at least one of the plurality of pixels is maintained in an off state and the photoelectric conversion unit of the at least one of the pixels accumulates charge generated in the first period in a first period from the first time point to the second time point, from the second time point to a third time point, the holding units of the plurality of pixels hold charge generated in the first period and charge generated in a second period from the second time point to the third time point, a state of the first transfer switches of the plurality of pixels are changed from an on state to an off state at the third time point, and the second transfer switches of the plurality of pixels are successively turned on and an output operation of successively outputting the plurality of signals to the output line is performed in a third period from the third time point to a fourth time point, wherein the operation performed a plurality of times includes a first operation and a second operation to be performed after the first operation, and wherein the discharge operation in the second operation is performed after the output operation in the first operation is terminated.

16. The imaging apparatus according to claim 15, wherein the holding unit includes a first semiconductor region of a first conductive type which holds the charge and a second semiconductor region of a second conductive type disposed on the first semiconductor region.

17. The imaging apparatus according to claim 15, further comprising waveguides disposed on the photoelectric conversion units of the pixels.

18. The imaging apparatus according to claim 15, further comprising:
a semiconductor substrate including the photoelectric conversion units and the holding units disposed thereon,
wherein an area of orthogonal projection of the photoelectric conversion unit to a surface which is parallel to a surface of the semiconductor substrate is smaller than an area of orthogonal projection of the holding unit to the same surface.

19. The imaging apparatus according to claim 15, wherein a saturation charge quantity $A_1$ of the photoelectric conversion unit, a saturation charge quantity $A_2$ of the holding unit, the first period $P_1$, and the second period $P_2$ satisfy the following relationship:

$$\frac{P_1 - 0.5 \times P_1}{(P_1 + P_2)} \leq \frac{A_1}{A_2} \leq \frac{P_1 + 0.5 \times P_2}{(P_1 + P_2)}.$$

20. An imaging system comprising:
the imaging apparatus set forth in claim 15; and
a signal processing apparatus configured to process a signal supplied from the imaging apparatus.

* * * * *